United States Patent
Lin et al.

(10) Patent No.: US 10,712,781 B2
(45) Date of Patent: Jul. 14, 2020

(54) CASING ASSEMBLY AND ELECTRONIC DEVICE HAVING THE SAME

(71) Applicant: ASUSTEK COMPUTER INC., Taipei (TW)

(72) Inventors: San-Feng Lin, Taipei (TW); Yen-Yu Chen, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/900,349

(22) Filed: Feb. 20, 2018

(65) Prior Publication Data

US 2018/0239395 A1    Aug. 23, 2018

(30) Foreign Application Priority Data

Feb. 17, 2017    (CN) .................... 2017 2 0144646 U

(51) Int. Cl.
```
G06F 1/16      (2006.01)
H05K 5/00      (2006.01)
H05K 7/00      (2006.01)
H05K 5/04      (2006.01)
```

(52) U.S. Cl.
CPC .......... *G06F 1/1656* (2013.01); *G06F 1/1637* (2013.01); *H05K 5/04* (2013.01); *G06F 1/1616* (2013.01); *G06F 1/1662* (2013.01); *H05K 5/0017* (2013.01)

(58) Field of Classification Search
CPC .... G06F 1/1662; G06F 1/1656; G06F 1/1637; G06F 1/1616; G06F 1/1613; G06F 1/1633; H05K 5/0017; H05K 5/04
See application file for complete search history.

(56) References Cited

U.S. PATENT DOCUMENTS

| | | | | |
|---|---|---|---|---|
| 3,650,312 A | * | 3/1972 | Allen | B22D 21/007 164/55.1 |
| 6,054,939 A | * | 4/2000 | Wei | H01H 13/70 200/513 |
| 8,199,477 B2 | * | 6/2012 | Mathew | G06F 1/1637 312/223.1 |
| 8,213,168 B2 | * | 7/2012 | McClure | G06F 1/1613 206/545 |
| 9,176,527 B2 | * | 11/2015 | Lee | G06F 1/1626 |
| 10,591,957 B2 | * | 3/2020 | McClure | H04B 1/3888 |
| 2001/0015005 A1 | * | 8/2001 | Chung | G06F 1/181 29/458 |
| 2003/0007323 A1 | * | 1/2003 | Huang | G06F 1/1616 361/679.09 |
| 2006/0120035 A1 | * | 6/2006 | Merz | G06F 1/187 361/679.34 |

(Continued)

*Primary Examiner* — Anthony M Haughton
(74) *Attorney, Agent, or Firm* — Muncy, Geissler, Olds & Lowe, P.C.

(57) ABSTRACT

A casing assembly of an electronic device is provided. The casing assembly of the electronic device is configured to connect a connecting assembly. The connecting assembly comprises a metal casing; and an injection-molded frame. The injection-molded frame includes a first surface and a second surface, the first surface is fixed to the metal casing, and the second surface is configured with a plurality of connecting structures. The connecting structures are fixed to the connecting assembly, and the connecting assembly is assembled to the metal casing via the connecting structures.

7 Claims, 8 Drawing Sheets

(56) References Cited

U.S. PATENT DOCUMENTS

| | | | |
|---|---|---|---|
| 2009/0067141 A1* | 3/2009 | Dabov | H01Q 1/42 |
| | | | 361/753 |
| 2009/0257207 A1* | 10/2009 | Wang | G06F 1/1626 |
| | | | 361/752 |
| 2010/0007609 A1* | 1/2010 | Watabe | G06F 1/1616 |
| | | | 345/168 |
| 2011/0090627 A1* | 4/2011 | Raff | G06F 1/1656 |
| | | | 361/679.02 |
| 2012/0281158 A1* | 11/2012 | Chen | G02F 1/133308 |
| | | | 349/15 |
| 2013/0076575 A1* | 3/2013 | Mai | H01Q 1/243 |
| | | | 343/702 |
| 2016/0192510 A1* | 6/2016 | Luo | B29C 45/14 |
| | | | 312/223.1 |

* cited by examiner

CASING ASSEMBLY AND ELECTRONIC DEVICE HAVING THE SAME

CROSS-REFERENCE TO RELATED APPLICATION

This application claims the priority benefit of CN application serial No. 201720144646.6, filed on Feb. 17, 2017. The entirety of the above-mentioned patent application is hereby incorporated by references herein and made a part of specification.

BACKGROUND OF THE INVENTION

Field of the Invention

The disclosure relates to a casing assembly and, more specifically, to a casing assembly of an electronic device.

Description of the Related Art

With the development of science and technology, most electronic devices provide lots of functions that meet varies requirements of common users. Manufactures also pursuit to provide improvement of user experience of electronic devices.

The appearance and weight of electronic devices directly affects user experiences. Therefore, in addition to high efficiency, electronic devices also tend to be light, small, and thin.

Generally, the strength of electronic devices is considered when the dimension of the electronic devices become thinner or smaller. For example, the casings of the electronic devices are usually made of metal material. Since various kinds of electronic components are configured in the electronic devices, connecting structures are needed to assemble the electronic components.

Please refer to FIG. 1. FIG. 1 is a schematic diagram showing a conventional casing of a keyboard of a notebook. A casing PA100a of a keyboard of a notebook is taken as an example. Conventionally, a metal sheet is formed by injecting or casting, and then the metal sheet is milled to form the casing PA100a of the keyboard of the notebook.

Connecting structures PA1, such as a stud and a hook, are arranged in the casing PA100a of the keyboard of the notebook to fix a mother board or a bottom casing. Connecting structures PA1 are usually manufactured by a milling process. With the connecting structures PA1 become more and more complex, the time cost and the manufacture cost are increased.

BRIEF SUMMARY OF THE INVENTION

According to an aspect of the disclosure, a casing assembly of an electronic device is provided. The casing assembly of the electronic device is configured to connect a connecting assembly. The connecting assembly comprises a metal casing; and an injection-molded frame. The injection-molded frame includes a first surface and a second surface, the first surface is fixed to the metal casing, and the second surface is configured with a plurality of connecting structures. The connecting structures are fixed to the connecting assembly, and the connecting assembly is assembled to the metal casing via the connecting structures.

According to an aspect of the disclosure, an electronic device is provided. The electronic device comprises a metal casing and an injection-molded frame. The injection-molded frame includes a first surface and a second surface, the first surface is fixed to the metal casing, and the second surface is configured with a plurality of connecting structures. A connecting assembly is configured to be fixed to the connecting structures, and the connecting assembly is assembled to the metal casing via the connecting structures.

According to an aspect of the disclosure, a method for manufacturing a casing assembly is provided. The method for manufacturing the casing assembly comprises the following steps: providing a metal casing; manufacturing an injection-molded frame via an injection-molding process, the injection-molded frame includes a plurality of connecting structures; coating adhesive to at least one of the metal casing and the injection-molded frame, and adhering the injection-molded frame to the metal casing via the adhesive.

As above, in the embodiments of the present disclosure, the casing assembly is formed by adhering the metal casing without complex structures or the injection-molded frame. Thus the metal casing is manufactured via a simpler thermally working process. Complex structures conventionally configured at the metal casing are changed to be configured on the injection-molded frame in embodiments. The metal casing is assembled to the corresponding structures via the connecting structures injected at the injection-molded frame. As a result, the process is simplified, and the production cost is decreased greatly.

DETAILED DESCRIPTION OF THE EMBODIMENTS

These and other features, aspects, and advantages of the present invention will become better understood with regard to the following description, appended claims, and accompanying drawings. However, the invention is not limited to the embodiments. The components shown in figures are not used for limit the size or the proportion.

Figure 1:
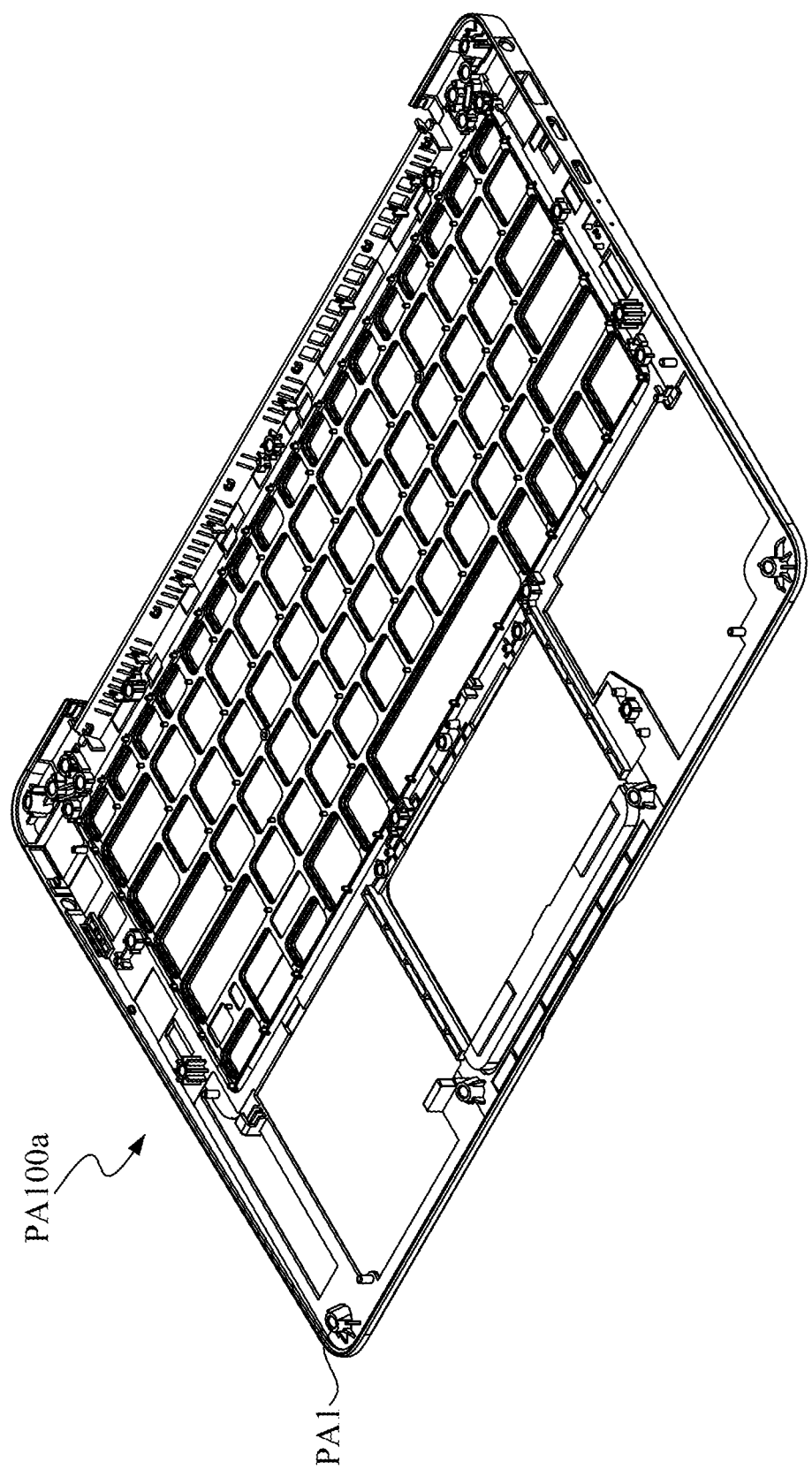
FIG. 1 is a schematic diagram showing a conventional casing of a keyboard of a notebook.
Figure 2:
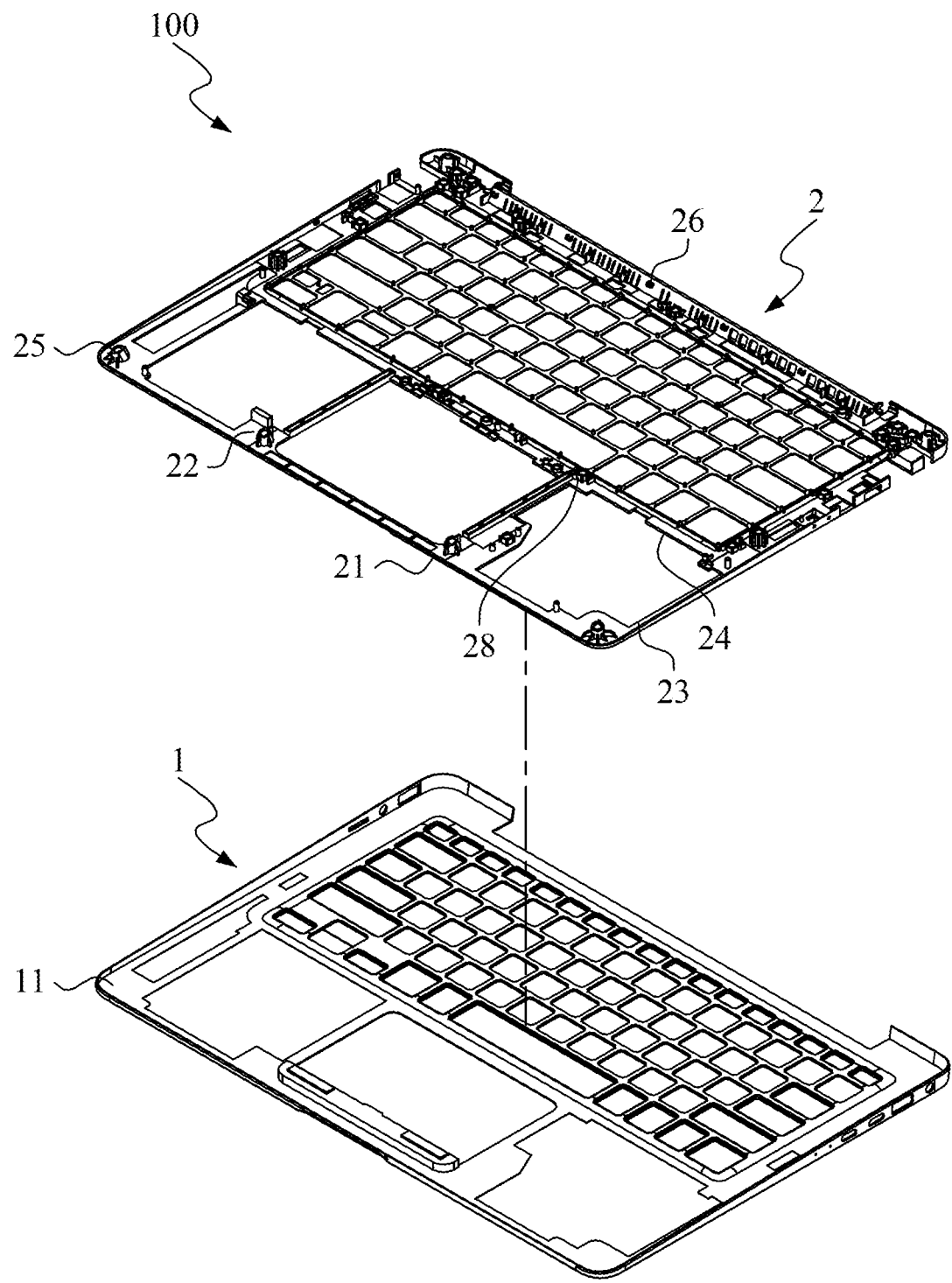
FIG. 2 is an exploded schematic diagram showing a casing assembly of an electronic device in an embodiment.
Figure 3:
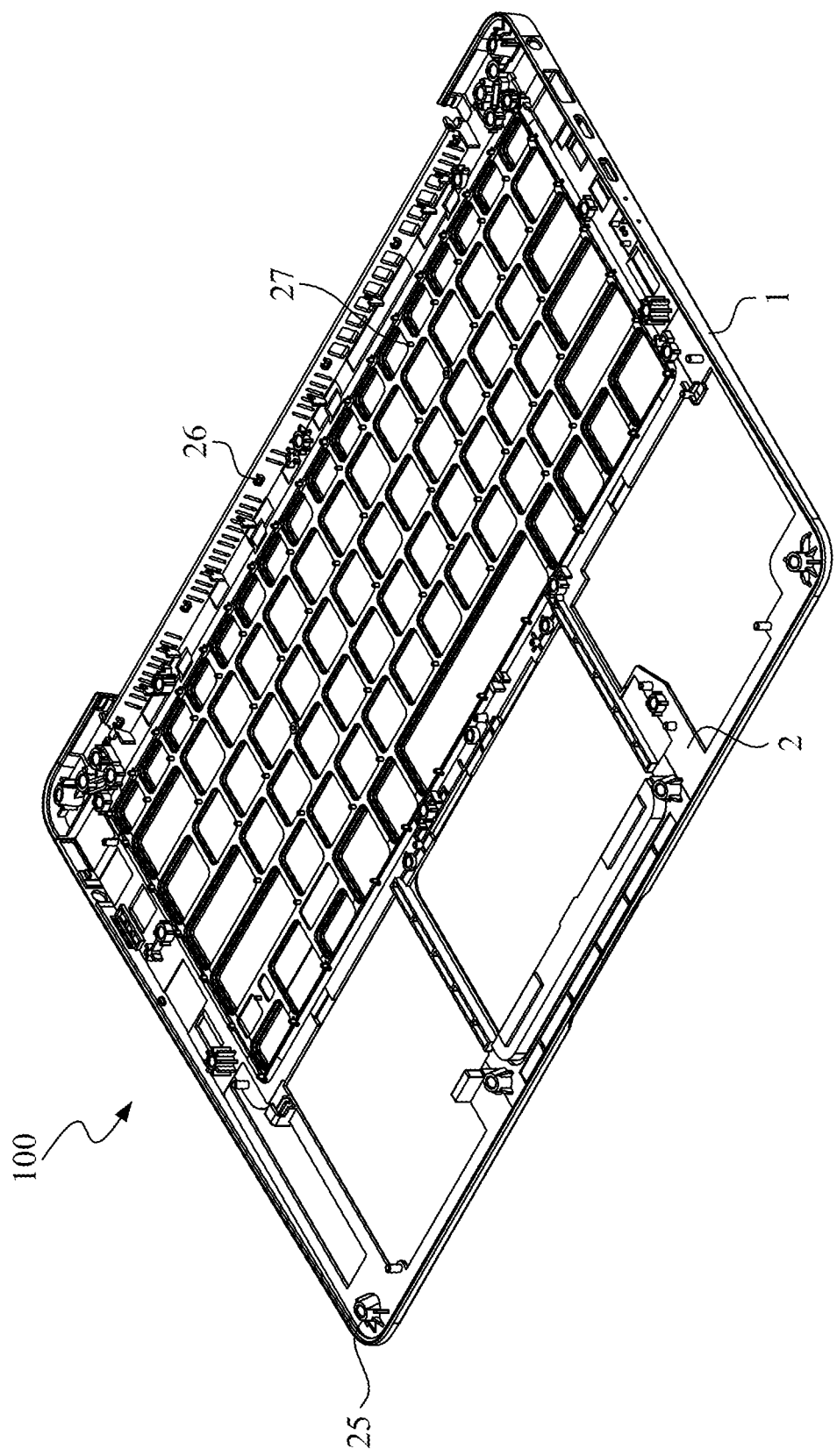
FIG. 3 is a schematic diagram of a casing assembly of an electronic device in an embodiment.

Please refer to FIG. 2 and FIG. 3. FIG. 2 is an exploded schematic diagram showing a casing assembly of an electronic device in an embodiment. FIG. 3 is a schematic diagram of a casing assembly of an electronic device in an embodiment. A casing assembly 100 of an electronic device includes a metal casing 1 and an injection-molded frame 2.

The metal casing 1 includes a connection surface 11. In the embodiment, the metal casing 1 is made of a magnesium alloy. The connection surface 11 is a flat connection surface. In the embodiment, the metal casing 1 is formed via a thermally working process. That is, the metal casing 1 is formed by plastic forming metal materials above a crystallization temperature. The thermally working process includes a die-casting process, and a thixo-molding process of metal semi-solid molding technology. The metal casing 1 manufactured via the die-casting process is a die-casted casing. The metal casing 1 manufactured via the thixo-molding process is a thixo-molded casing. In an embodiment, the metal casing 1 is manufactured via a thixo-casting process, a rheo-casting process or a rheo-molding.

The injection-molded frame 2 includes a first surface 21 and a second surface 22 opposite to each other. The first surface 21 is adhered to the connection surface 11 via an adhesive (not shown). The injection-molded frame includes an outer frame 23, a plurality of crossing components 24 (one crossing component is shown), a plurality of connecting structures 25, 26 and 28 (three connecting structures are shown in the FIG. 2) and a plurality of positioning structures 27 (one positioning structure is shown).

The outer frame 23 includes a plurality of frames integrally connected together. The crossing components 24 are integrally connected to the frames of the outer frame 23, respectively. The connecting structures 25 and 26 are integrally configured on the outer frame 23 and configured on the second surface 22 respectively. The connecting structure 28 is integrally configured on the crossing component 24 and configured on the second surface 22. The connecting structure 28 configured on the crossing component 24 is integrally connected to the outer frame 23 crossedly via the crossing component 24.

In the embodiment, the connecting structures 25 and 26 are integrally configured on the outer frame 23 and the second surface 22 of the crossing component 24 facing the metal casing 1 respectively. Therefore, after the first surface 21 of the injection-molded frame 2 is adhered to the connection surface 11 of the metal casing 1, the connecting structures 25 and 26 protrude towards the direction away from the metal casing 1. In an embodiment, the connecting structure 25 is a screwing structure, and the connecting structure 26 is a locking structure such as a clip-on structure, which is not limited herein. In an embodiment, the locking structure is a clamping structure or a hooking structure. Practically, the connecting structures 25 and 26 are configured to connect other corresponding components, such as a casing of a host or other electronic components.

The positioning structure 27 is integrally connected to the crossing component 24. The positioning structure 27 is configured on the surface of the crossing component 24 facing the metal casing 1. Therefore, after the injection-molded frame 2 is adhered to the connection surface 11 of the metal casing 1, the positioning structures 27 protrude towards the direction away from the metal casing 1. In practice, the positioning structure 27 is used to locate other corresponding components such as a key module.

The material of the injection-molded frame 2 is a high-molecular polymer such as plastic or rubber. The injection-molded frame 2 is formed via an injection-molding process. The injection-molding process is a plastic injection-molding process, a rubber injection-molding process and a mixed injection-molding process depends on different high-molecular polymers.

When the injection-molded frame 2 is made of plastic and manufactured via the plastic injection-molding process, the injection-molded frame 2 is a plastic injection-molded frame. When the injection-molded frame 2 is made of rubber and manufactured via the rubber injection-molding process, the injection-molded frame 2 is a rubber injection-molded frame. When the injection-molded frame 2 is made of plastic and rubber and manufactured via the mixed injection-molding process, the injection-molded frame 2 is a mixed injection-molded frame.

Figure 4:
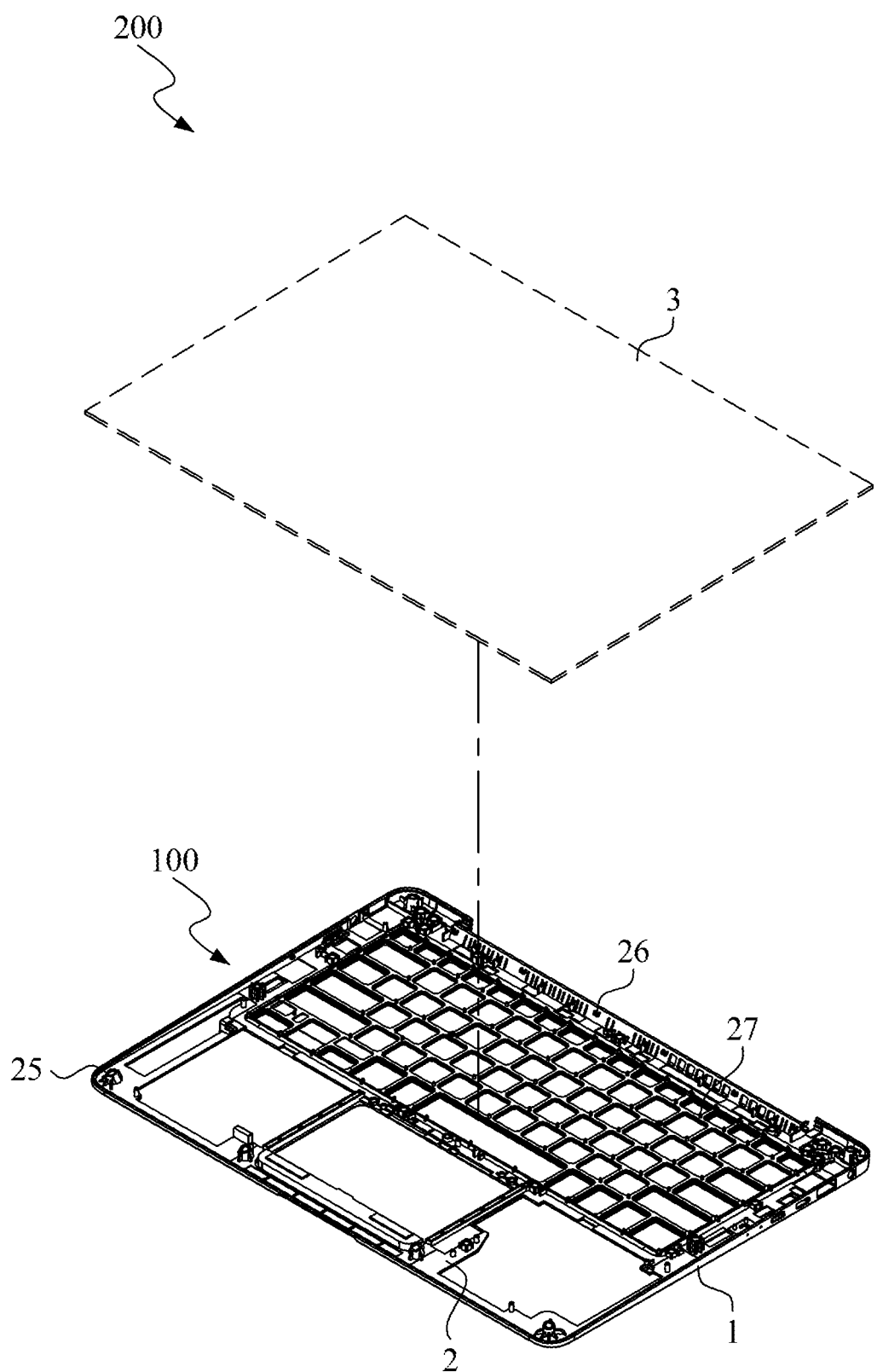
FIG. 4 is a schematic diagram showing an electronic device in an embodiment.

Please refer to FIG. 4. FIG. 4 is a schematic diagram showing an electronic device in an embodiment. As shown in FIG. 4, an electronic device 200 includes the casing assembly 100 of the electronic device and a connecting assembly 3. In the embodiment, the electronic device 200 is a keyboard.

The above connecting structures 25 and 26 are configured to be fixed with the connecting assembly 3. Then, the connecting assembly 3 is assembled to the metal casing 1 via the connecting structures 25 and 26. In the embodiment, the connecting assembly 3 is the bottom casing of the keyboard, and the metal casing 1 is an upper casing of the keyboard. After the connecting assembly 3 is assembled to the metal casing 1 via the connecting structures 25 and 26, a keyboard is assembled. In an embodiment, the connecting assembly 3 is configured with a connecting structure (not shown) corresponding to the connecting structures 25 and 26.

Figure 5:
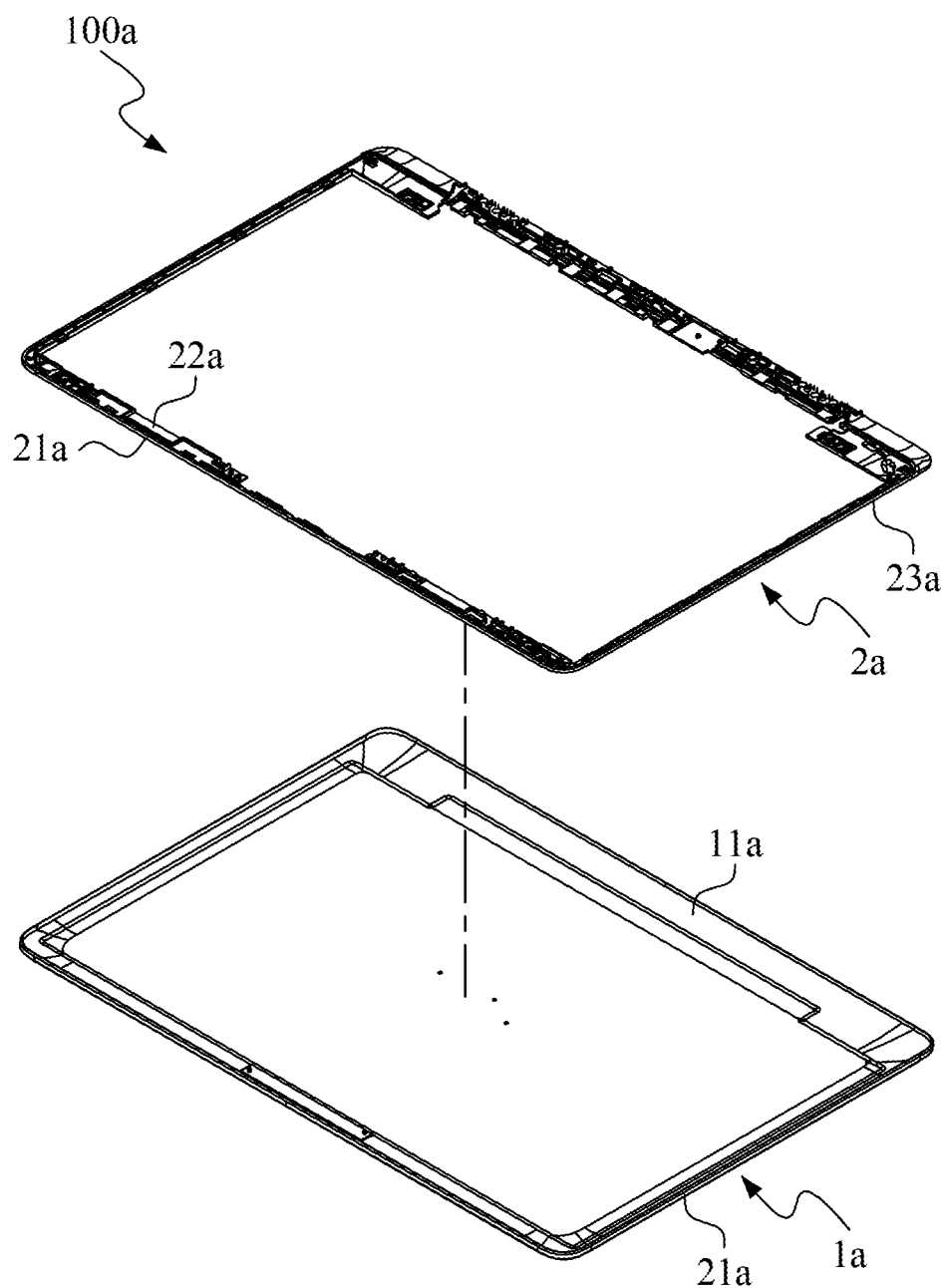
FIG. 5 is an exploded schematic diagram showing a casing assembly of an electronic device in an embodiment.
Figure 6:
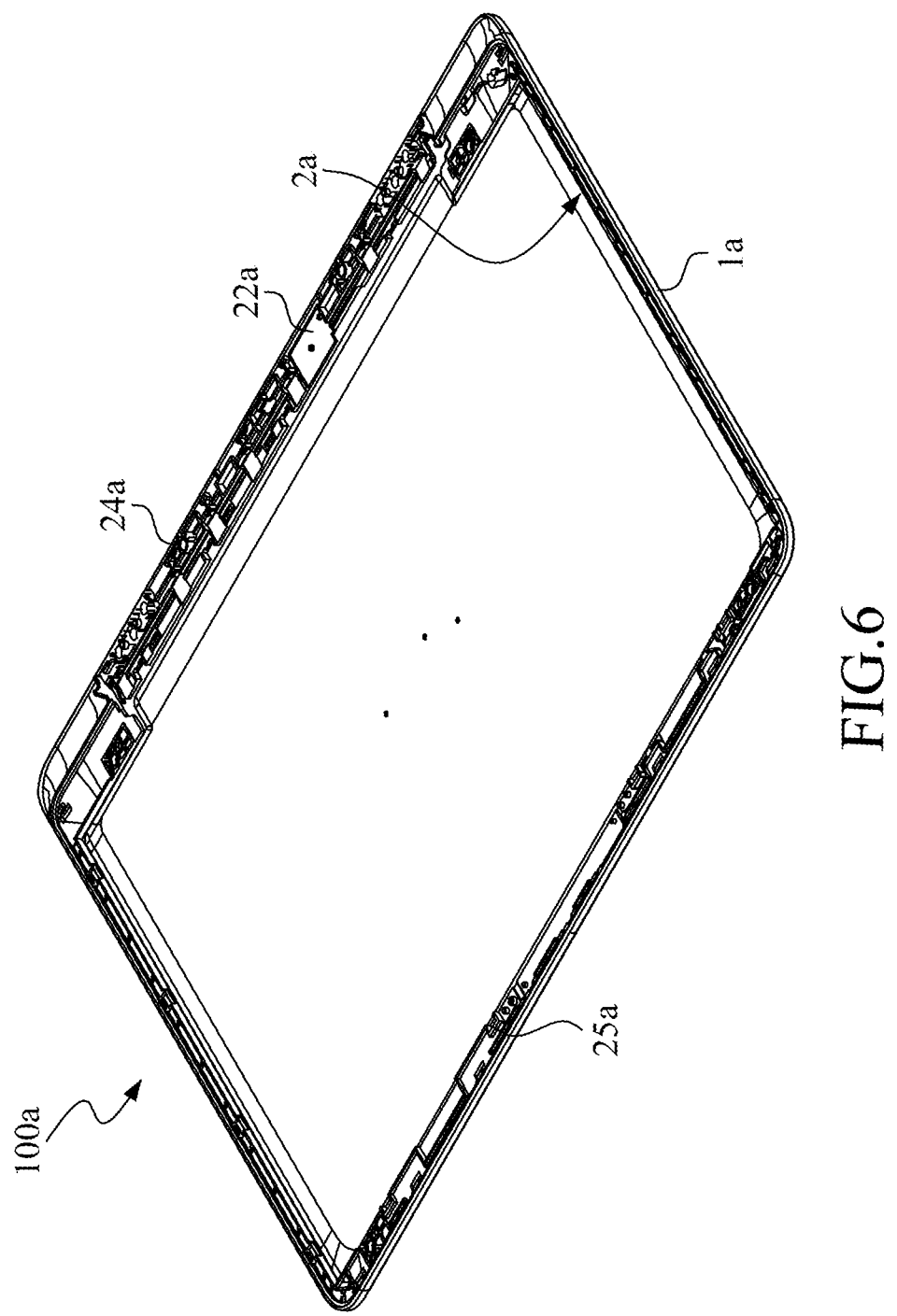
FIG. 6 is a schematic diagram showing a casing assembly of an electronic device in an embodiment.

Please refer to FIG. 5 and FIG. 6. FIG. 5 is an exploded schematic diagram showing a casing assembly of an electronic device in an embodiment. FIG. 6 is a schematic diagram showing a casing assembly of an electronic device in an embodiment. As shown in FIG. 5 and FIG. 6, a casing assembly 100a of an electronic device includes a metal casing 1a and an injection-molded frame 2a.

The metal casing 1a includes a connection surface 11a. In the embodiment, the connection surface 11a is a flat connection surface. Both of the metal casing 1a and the above metal casing 1 are manufactured by thermally working process, which is not descripted again.

The injection-molded frame 2a includes a first surface 21a and a second surface 22a opposite to the first surface 21a. The first surface 21a is adhered to the connection surface 11a. The injection-molded frame 2a includes an outer frame 23a and a plurality of connecting structures 24a and 25a (two connecting structures are shown). The outer frame 23a includes a plurality of frames intergratedly connected together. The connecting structures 24a and 25a are intergratedly configured on the outer frame 23a and configured on the second surface 22a, respectively.

In the embodiment, the connecting structures 24a and 25a are integrally configured on the second surface 22a respectively. Therefore, after the first surface 21a of the injection-molded frame 2a is adhered to the connection surface 11a of the metal casing 1a, the connecting structures 24a and 25a protrude towards the direction away from the metal casing 1a in the injection molding process. In an embodiment, the connecting structure 24a is a screwing structure, and the connecting structure 25a is a locking structure such as a clip-on structure, which is not limited herein.

In an embodiment, the locking structure is a clamping structure or a hooking structure. In practice, the connecting structures 24a and 25a are used to connect other corresponding components, such as a casing of a host or other electronic components.

Similar to the injection-molded frame 2, the injection-molded frame 2a is also made of a high-molecular polymer via an injection-molding process, which is not descripted again.

Figure 7:
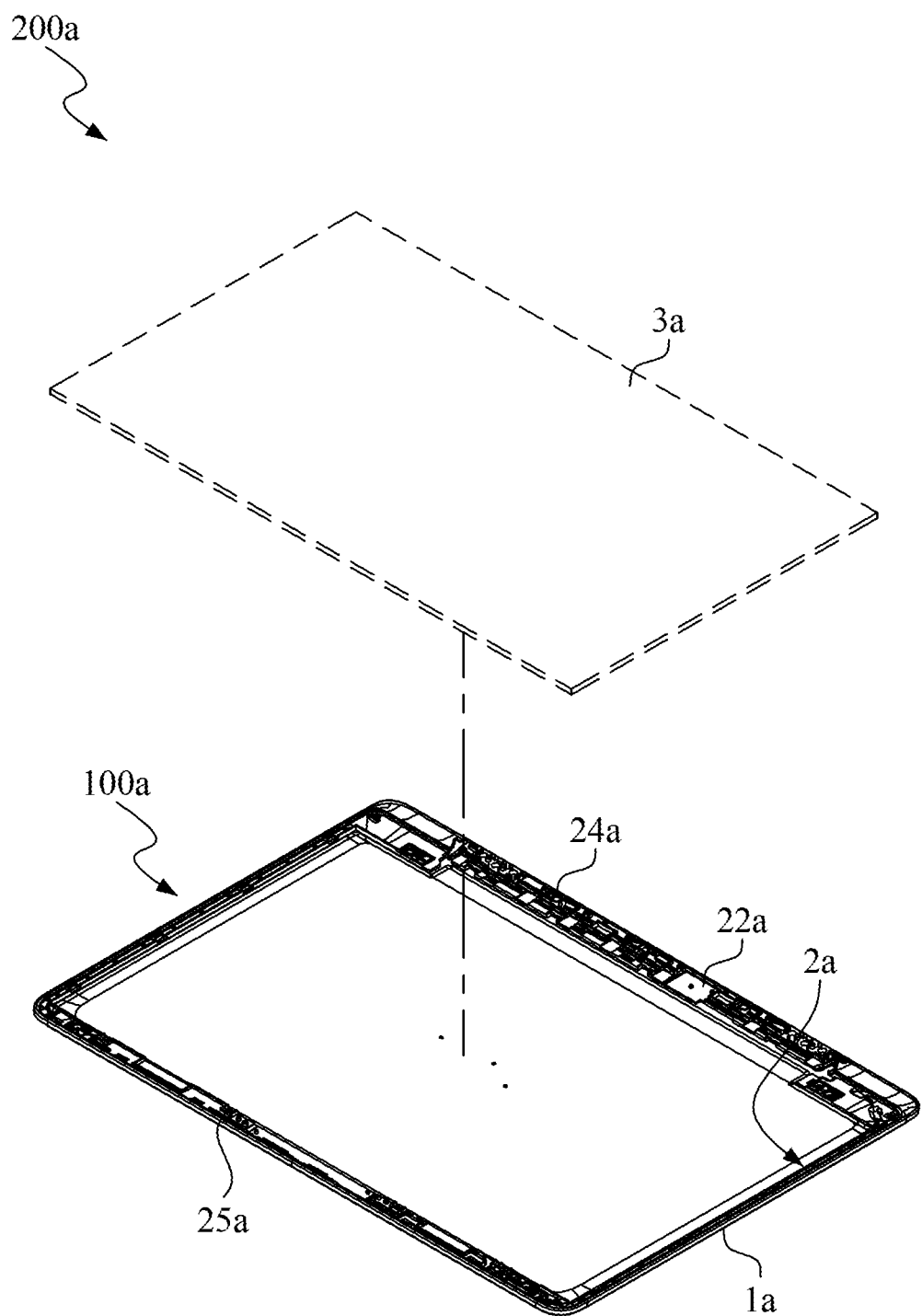
FIG. 7 is an exploded schematic diagram showing an electronic device in an embodiment.

Please refer to FIG. 7. FIG. 7 is an exploded schematic diagram showing an electronic device in an embodiment. As shown in FIG. 7, an electronic device 200a includes a casing assembly 100a and a connecting assembly 3a. In the embodiment, the electronic device 200a is a display.

The connecting structures 24a and 25a and the connecting assembly 3a are configured to be fixed to each other. Then, the connecting assembly 3a is assembled to the metal casing 1a via the connecting structures 24a and 25a. In the embodiment, the connecting assembly 3a is a display panel assembly, and the metal casing 1a is a back casing of a display. After the connecting assembly 3a is assembled to the metal casing 1a via the connecting structures 24a and 25a, a display is formed. In an embodiment, the connecting assembly 3a is configured with a connecting structure (not shown) corresponding to the connecting structures 24a and 25a.

Figure 8:
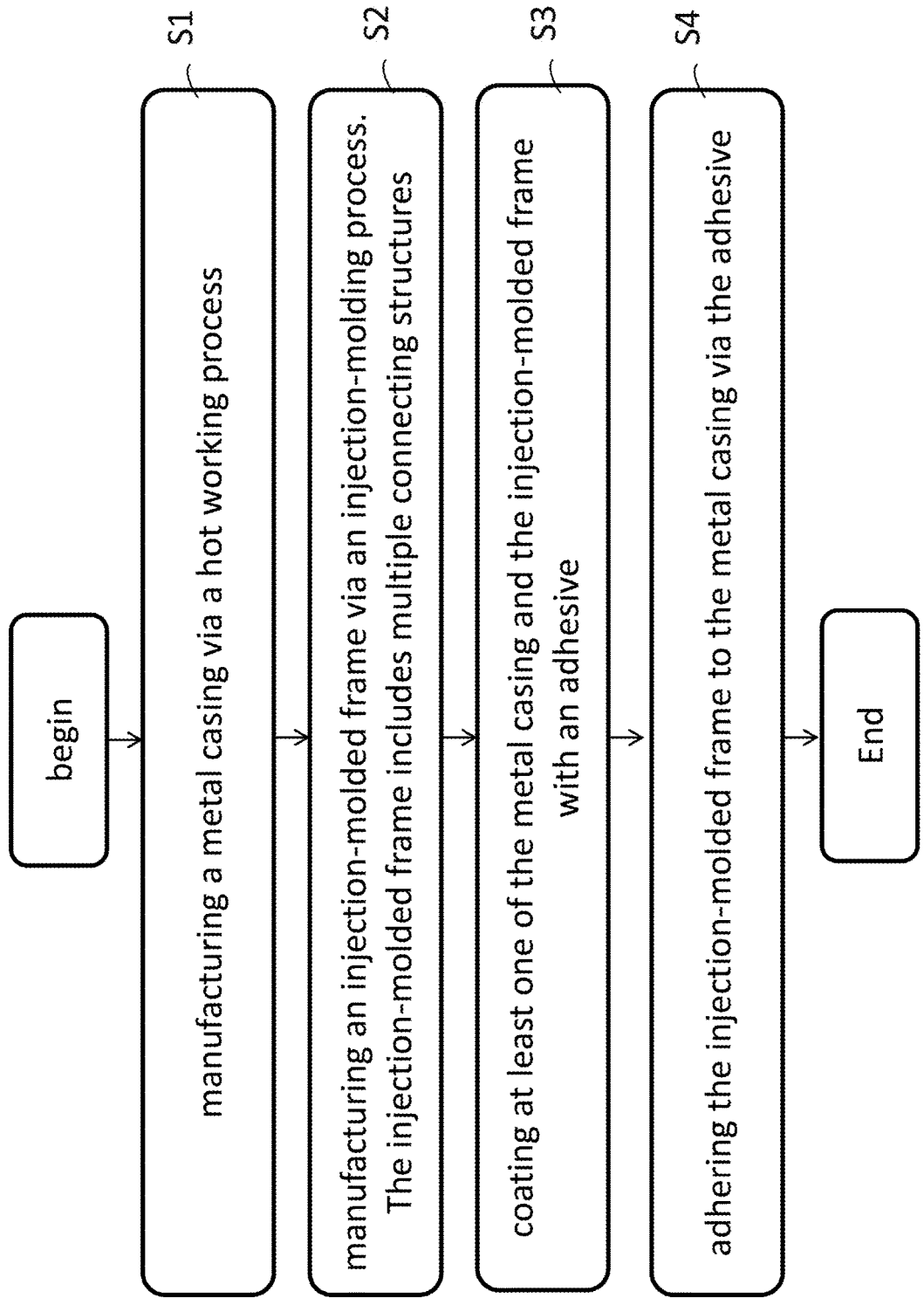
FIG. 8 is a flow chart of a method for manufacturing a casing assembly in an embodiment.

Please refer to FIG. 8. FIG. 8 is a flow chart of a method for manufacturing a casing assembly in an embodiment. As shown in FIG. 8, the casing assembly 100 of an electronic device is taken as an example. A method for manufacturing a casing assembly includes following steps.

In step S1, a metal casing 1 is manufactured via a thermally working process.

In step S2, an injection-molded frame 2 is manufactured via an injection-molding process. The injection-molded frame 2 includes connecting structures 25 and 26.

In step S3, at least one of the metal casing 1 and the injection-molded frame 2 is coated with an adhesive. In the embodiment, in step S3, the surface of injection-molded frame 2 facing the metal casing 1 is coated with the adhesive.

In step S4, the injection-molded frame 2 is adhered to the metal casing 1, and then the casing assembly 100 of the electronic device is formed. In the embodiment, in step S4, after the adhesive is coated on the surface of the injection-molded frame 2 facing the metal casing 1 in step S3, the injection-molded frame 2 is adhered to the connection surface 11 of the metal casing 1.

In sum, in a conventional process for manufacturing a casing of an electronic device, a metal sheet with a specific shape is manufactured via the injection molding process or the die-casting process. It needs much time to mill the metal sheet into a complex connecting structure. Therefore, the production cost is increased greatly. In contrast, in the casing assembly of the electronic device of the embodiments, most structures are formed via the injecting process, and then the injection-molded frame and the metal casing are adhered together.

Moreover, complex connecting structures corresponding to the connecting assembly is formed at the injection-molded frame in the embodiments, instead of configured on the metal casing as the conventional method. Therefore, the metal casing is easily formed via a thermally working process, which is time saving and easier. The casing assembly of the electronic device can be manufactured more quickly and easily. The production cost is decreased greatly.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A casing assembly of an electronic device, configured to connect a connecting assembly, comprising:
   a metal casing; and
   an injection-molded frame, made of a high-molecular polymer, including an outer frame, a first surface and a second surface opposite to the first surface, the first surface being adhered to the metal casing via an adhesive, the second surface being configured with at least two connecting structures being fixed to the connecting assembly, and the connecting assembly being assembled to the metal casing via the at least two connecting structures;
   wherein one of the at least two connecting structures is a screwing structure integrally configured on the outer frame, and another one of the at least two connecting structures is a clip-on structure integrally configured on the second surface;
   wherein, after the first surface is adhered to the metal casing, the at least two connecting structures protrude toward a direction away from the metal casing.

2. The casing assembly of an electronic device of claim 1, wherein the connecting assembly configured to be fixed to the at least two connecting structures is assembled to the metal casing via the at least two connecting structures.

3. The casing assembly of an electronic device of claim 1, further including a crossing component and a further connecting structure, wherein the crossing component is integrally configured to the outer frame, and the further connecting structure is integrally configured at the crossing component on the second surface.

4. The casing assembly of an electronic device of claim 1, wherein the metal casing is manufactured by a hot work process, and the hot work process is one of a die-casting process and a thixo-molding process.

5. The casing assembly of an electronic device of claim 1, wherein the injection-molded frame is manufactured by an injection-molding process, and the injection-molding process is one of a plastic injection-molding process, a rubber injection-molding process and a mixed injection-molding process.

6. The casing assembly of an electronic device of claim 1, wherein the metal casing is made of a magnesium alloy.

7. The casing assembly of an electronic device of claim 1, wherein the high-molecular polymer is one of a plastics or a rubber.

* * * * *